US008592901B1

(12) United States Patent
Sheu et al.

(10) Patent No.: US 8,592,901 B1
(45) Date of Patent: Nov. 26, 2013

(54) METAL OXIDE SEMICONDUCTOR FIELD TRANSISTOR AND METHOD OF FABRICATING THE SAME

(71) Applicant: Nuvoton Technology Corporation, Hsinchu (TW)

(72) Inventors: Gene Sheu, Hsinchu (TW); MD Imran Siddiqui, Hsinchu (TW); Abijith Prakash, Hsinchu (TW); Shao-Ming Yang, Hsinchu (TW); Jung-Ruey Tsai, Hsinchu (TW)

(73) Assignee: Nuvoton Technology Corporation, Hsinchu (TW)

(*) Notice: Subject to any disclaimer, the term of this patent is extended or adjusted under 35 U.S.C. 154(b) by 0 days.

(21) Appl. No.: 13/688,231

(22) Filed: Nov. 29, 2012

(30) Foreign Application Priority Data

Aug. 31, 2012 (TW) .............................. 101131784 A (51) Int. Cl.
*H01L 29/66* (2006.01)
(52) U.S. Cl.
USPC .................... 257/335; 257/339; 257/E29.007; 257/E21.427; 438/286
(58) Field of Classification Search
USPC .................... 257/335, 339, E29.007, E21.427; 438/286
See application file for complete search history.

(56) References Cited

U.S. PATENT DOCUMENTS

| 5,258,636 A | 11/1993 | Rumennik et al. |
| 5,633,521 A | 5/1997 | Koishikawa |
| 6,207,994 B1 | 3/2001 | Rumennik et al. |
| 6,448,620 B2 * | 9/2002 | Hayasaki et al. ............. 257/404 |
| 7,205,629 B2 * | 4/2007 | Singh ............................ 257/492 |
| 7,449,762 B1 * | 11/2008 | Singh ............................ 257/493 |
| 2003/0003638 A1 * | 1/2003 | Bromberger et al. ......... 438/197 |
| 2008/0079072 A1 | 4/2008 | Lee |
| 2008/0197418 A1 | 8/2008 | Parthasarathy et al. |

FOREIGN PATENT DOCUMENTS

TW 201023360 6/2010

OTHER PUBLICATIONS

S.H. Lee, et al., "700V Lateral DMOS with New Source Fingertip Design", IEEE, Proceedings of the 20th International Symposium on Power Semiconductor Devices & IC's, May 2008, Oralando, pp. 141-144.
Hutomo Suryo Wasisto, et al., "A Novel 800V Multiple RESURF LDMOS Utilizing Linear P-top Rings", IEEE, Tencon, 2010, pp. 75-79.

* cited by examiner

*Primary Examiner* — Trung Q Dang
(74) *Attorney, Agent, or Firm* — Jianq Chyun IP Office (57) ABSTRACT

A metal oxide semiconductor field transistor including a gate electrode, a gate dielectric layer, a source region, a drain region, and a top doped region are provided. The drain region of a first conductivity type is located in a substrate. The source region of the first conductivity type is located in the substrate and surrounded the drain region. The gate electrode is located above the substrate between the source region and the drain region. The gate dielectric layer is located between the gate electrode and the substrate. The top doped region of a second conductivity type is located in the substrate between the gate electrode and the drain region. The top doped region includes at least three regions. Each of the three regions has a dopant concentration gradient and a concentration gradually decreased from a region adjacent the gate electrode to a region adjacent the drain region.

20 Claims, 11 Drawing Sheets

METAL OXIDE SEMICONDUCTOR FIELD TRANSISTOR AND METHOD OF FABRICATING THE SAME

CROSS-REFERENCE TO RELATED APPLICATION

This application claims the priority benefit of Taiwan application serial no. 101131784, filed on Aug. 31, 2012. The entirety of the above-mentioned patent application is hereby incorporated by reference herein and made a part of this specification.

BACKGROUND OF THE INVENTION

1. Field of the Invention

The invention relates to a semiconductor device, and more particularly to a metal oxide semiconductor field transistor.

2. Description of Related Art

A high breakdown voltage and a low on-state resistance must be provided to reduce power loss when operating an ultra high voltage device. Currently, array structures are developed to provide higher current while maintaining sufficient breakdown voltage. In layouts of AC-DC products, layout areas may be reduced and the performance of devices may be enhanced through the array structures. As for an ultra high voltage device being developed in present days, a source region and a drain region thereof are formed in a shape of interdigitated fingers. Although a source terminal and a drain terminal having the shape of interdigitated fingers may decrease the layout area, however, a curvature thereof is quite large. A large current is particularly accumulated at the source terminal and/or drain terminal which becomes a breakdown point, thereby decreasing the breakdown voltage of the device.

SUMMARY OF THE INVENTION

According to an embodiment of the invention, a metal oxide semiconductor field transistor is provided. The metal oxide semiconductor field transistor includes a gate electrode, a gate dielectric layer, a source region, a drain region, and a top doped region. The drain region of a first conductivity type is located in a substrate. The source region of the first conductivity type is located in the substrate and surrounded the drain region. The gate electrode is located above the substrate between the source region and the drain region. The gate dielectric layer is located between the gate electrode and the substrate. The top doped region of a second conductivity type is located in the substrate between the source region and the drain region. The top doped region includes at least three regions respectively having a dopant concentration gradient and a concentration gradually decreased from a region adjacent to the gate electrode to a region adjacent to the drain region.

According to another embodiment of the invention, a method of fabricating a metal oxide semiconductor field transistor is further provided. A patterned mask layer having a plurality of openings is formed on a substrate. An ion implantation process is performed to form a top doped region in the substrate by using the patterned mask layer as a mask. A gate dielectric layer and a gate electrode are formed on the substrate, wherein the top doped region is located on a first side of the gate electrode. A drain region of a first conductivity type is formed on the first side of the gate electrode. A source region of the first conductivity type is formed on a second side of the gate electrode. The source region is located in the substrate and surrounding the drain region. The aforementioned top doped region of a second conductivity type is formed between the source region and the drain region. The top doped region has a dopant concentration gradient, and the dopant concentration gradient has a concentration gradually decreased from a region adjacent to the gate electrode to a region adjacent to the drain region.

To make the above features and advantages of the invention more comprehensible, several embodiments accompanied with drawings are described in detail as follows.

DESCRIPTION OF THE EMBODIMENTS

Figure 1A:
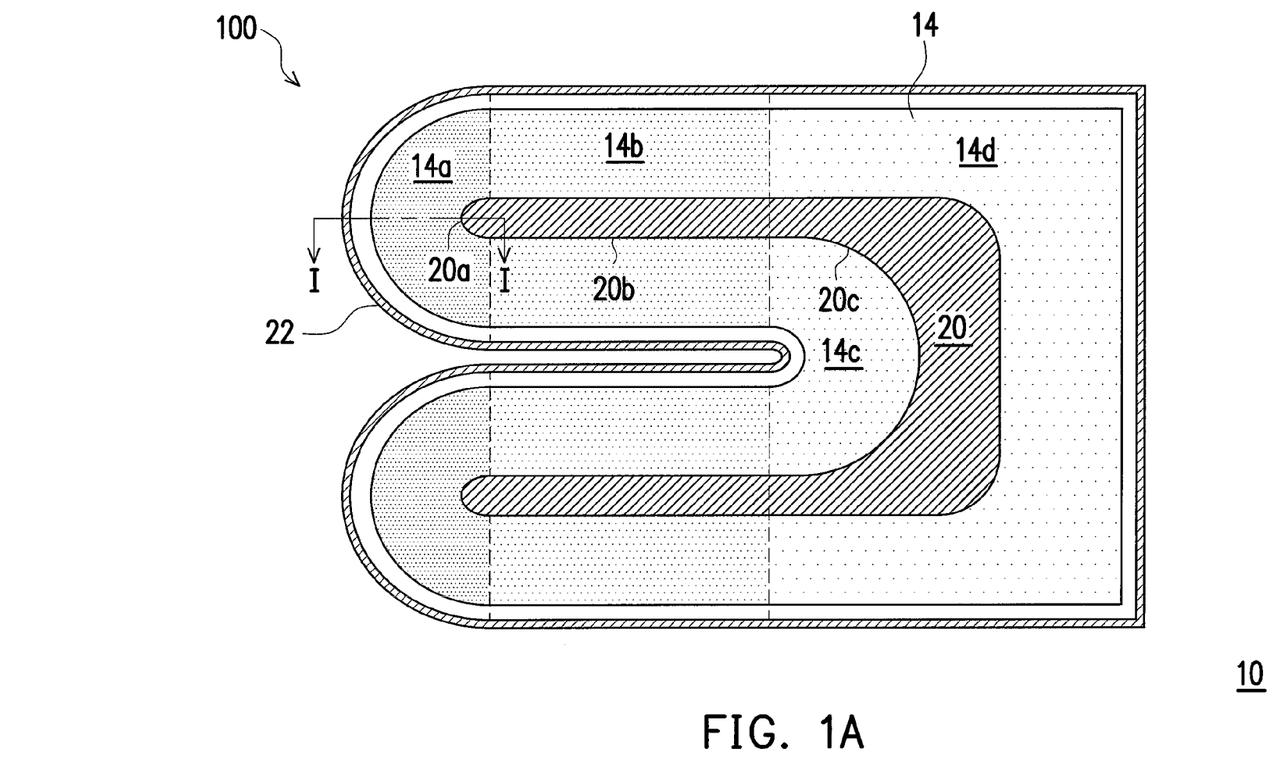
FIGS. 1A, 1B and 1C are top views respectively illustrating a metal oxide semiconductor field transistor according to an embodiment of the invention.
Figure 1B:
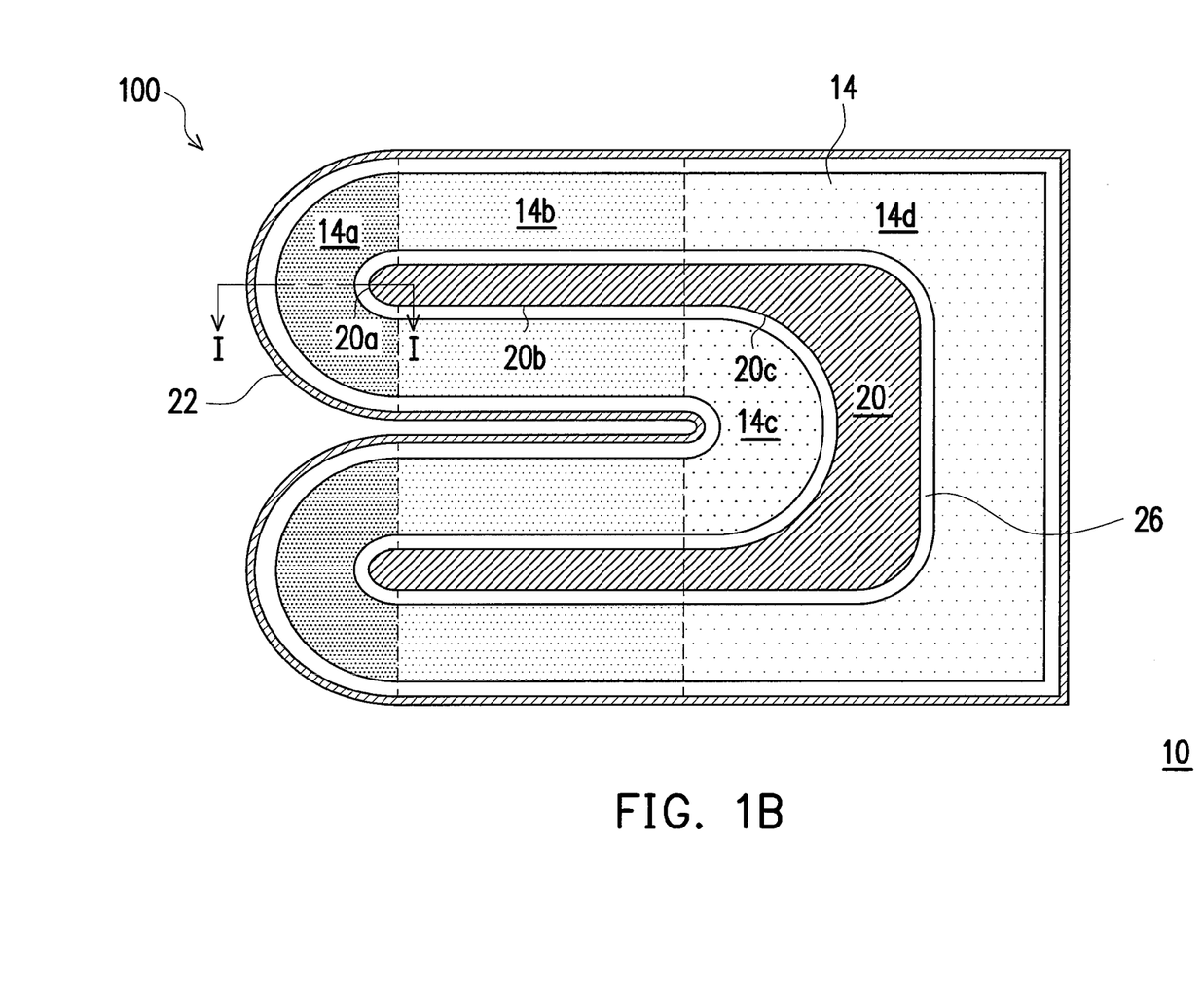
Figure 1C:
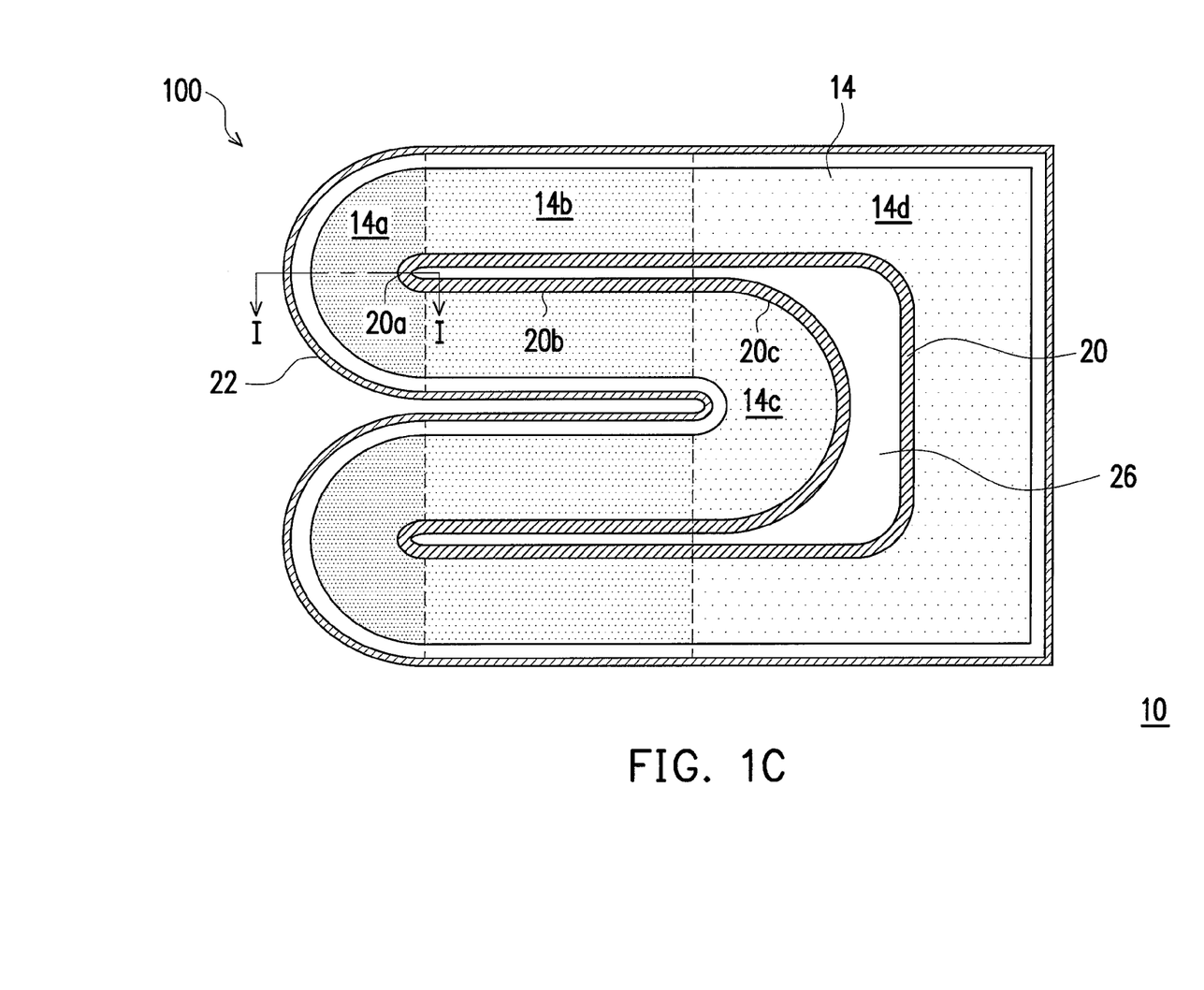
Figure 2:
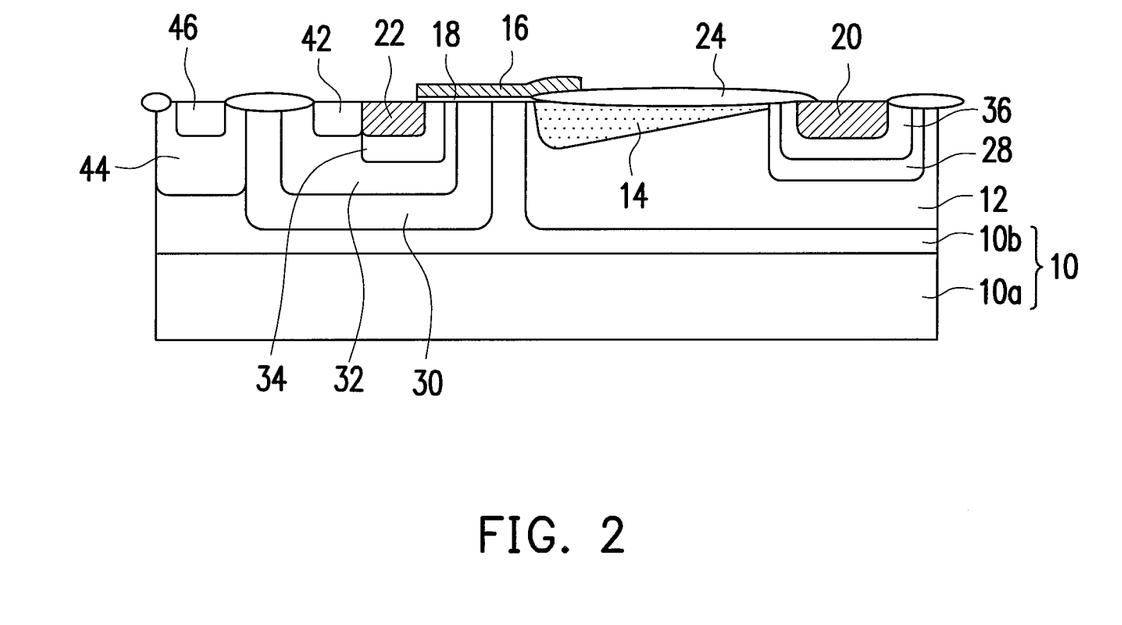
FIG. 2 is a cross-sectional diagram of FIG. 1A, 1B or 1C along line I-I. For clear illustration, only relative positions of a source region, a drain region and a top doped region are illustrated in FIGS. 1A, 1B and 1C.

FIGS. 1A, 1B and 1C are top views respectively illustrating a metal oxide semiconductor field transistor according to an embodiment of the invention. FIG. 2 is a cross-sectional diagram of FIG. 1A, 1B or 1C along line I-I. For clear illustration, only relative positions of a source region, a drain region and a top doped region are illustrated in FIG. 1A, 1B or 1C.

Referring to FIG. 1A and FIG. 2, a metal oxide semiconductor field transistor 100 according to an embodiment of the invention includes a gate electrode 16, a gate dielectric layer 18, a source region 22, a drain region 20 and a top doped region 14. The drain region 20 is located in a substrate 10. According to another embodiment, the metal oxide semiconductor field transistor 100 may further include a first doped region 12, a second doped region 30, a third doped region 32, a fourth doped region 28 and heavily doped regions 34 and 36.

The substrate 10 may be a semiconductor substrate 10a, for example, a silicon substrate. The semiconductor substrate 10a may include a P-type dopant or a N-type dopant therein. The P-type dopant may be an ion of group 111A such as a boron ion. The N-type dopant may be an ion of group VA such as an arsenic ion or a phosphorous ion. According to another embodiment of the invention, the substrate 10 may also include a semiconductor substrate 10a and an epitaxial layer 10b located thereon. In the present embodiment, the semiconductor substrate 10a is a P-type substrate, while the epitaxial layer 10b may be a N-type layer (N-epi).

The first doped region 12 (e.g., a first N-type well region) of a first conductivity type is located in the substrate 10, and the top doped region 14, the fourth doped region (e.g., a second N-type well region) 28, the heavily doped region 36 and the drain region 20 are located in the first doped region 12. The fourth doped region 28 of the first conductivity type is adjacent to the top doped region 14. A dopant concentration of the fourth doped region 28 is higher than that of the first doped region 12.

The heavily doped region 36 of the first conductivity type is located in the fourth doped region 28. A dopant concentration of the heavily doped region 36 is higher than that of the fourth doped region 28 and may be used for reducing serial resistance and increasing breakdown voltage.

The drain region 20 of the first conductivity type is located in the heavily doped region 36. A dopant concentration of the drain region 20 is higher than that of the heavily region 36. A shape of the drain region 20 projected to a surface of the substrate 10 is, for example, at least a U-shape. According to another embodiment, the shape of the drain region 20 projected to the surface of the substrate 10 may be composed by two or more U-shapes or other shapes. In the present embodiment, the drain region 20 may be divided into a starting portion 20a, a connecting portion 20b and a bottom portion 20c. In the present embodiment, corners of the starting portion 20a and the bottom portion 20c are illustrated in arc shapes, but the invention is not limited thereto. The starting portion 20a may be a semi-circle, or may also be other arc shapes such as a quarter circle, an one-eighth circle and so on, detailed description thereof are omitted hereinafter. In another embodiment, the starting potion 20a may also be a rectangle.

The second doped region (e.g., a HVNW) 30 having the first conductivity type is located in the substrate 10. The third doped region (e.g., the P-type well region) 32, the heavily doped region 34 and the source region 22 are located in the second doped region 30. The third doped region 32 of a second conductivity type is located in the second doped region 30. The heavily doped region 34 is located in the third doped region 32 and may be used for reducing serial resistance and increasing breakdown voltage.

The gate electrode 16 is located above the substrate 10 between the source region 22 and the drain region 20. More specifically, according to an embodiment, the gate electrode 16 is extended from the source region 22 towards the drain region 20 to cover the first doped region 12 and a portion of the top doped region 14. According to another embodiment, the gate electrode 16 is extended from the source region 22 and covers the heavily doped region 34, the third doped region 32, the second doped region 30, the first doped region 12 and a portion of the top doped region 14 in sequence. The gate electrode 16 can be made of a stacking layer of conductive materials such as metal, undoped polysilicon, doped polysilicon, polysilicide or a combination thereof. According to an embodiment, the gate electrode 16 and the top doped region 14 are spaced apart by an isolation structure (or a drifting isolation structure) 24. By using an architecture in which the gate electrode 16 partially covers the isolation structure 24, a position with largest strength of electric field within the electronic field formed between the drain region 20 and the source region 22 may shift towards below the isolation structure 24 instead of below the gate dielectric layer 18, so as to prevent the gate dielectric layer 18 with a thinner thickness being punctured by overpowered electric field. The isolation structures 24 may be, for example, a local thermal oxidation isolation structure made of an isolation material such as silicon oxide. The gate dielectric layer 18 is located between the gate electrode 16 and the substrate 10.

The top doped region 14 of the second conductivity type is located on a first side of the gate electrode 16. More specifically, the top doped region 14 is located in the first doped region 12 between the gate electrode 16 and the drain region 20 and adjacent to the fourth doped region 28, and a part of the top doped region 14 may be overlaid by gate electrode 16. Based on a position relation to the drain region 20, the top doped region 14 may include at least three regions. According to an embodiment, a shape of the drain region 20 projected to a surface of the substrate 10 is at least a U-shape; the top doped region 14 surrounds a region surrounded by the U-shape of the drain region 20 and extended to a periphery of the U-shape. As shown in FIG. 1A to 1C, according to an embodiment, the top doped region may include at least four regions, namely, the top turning region 14a, a rectangle region 14b, a bottom internal turning region 14c and a bottom external turning region 14d. The top turning region 14a surrounds the starting portion 20a of the drain region 20. The rectangle region 14b is located around the connecting portion 20b of the drain region 20. The bottom internal turning region 14c is located within a region surrounded by the bottom portion 20c of the drain region 20. The bottom external turning region 14d is located outside of a region surrounded by the bottom portion 20c of the drain region 20. Each of the regions in the top doped region 14 respectively has a dopant concentration gradient and a concentration of each region is gradually decreased from a region adjacent to the gate electrode 16 to a region adjacent to the drain region 20. According to an embodiment, a dopant concentration gradient of each region of the top doped region 14 is presented in linearly. That is, the concentration of each region in the top doped region 14 is gradually decreased in linearity from a region adjacent to the gate electrode 16 to a region adjacent to the drain region 20. A depth of each region in the top doped region 14 is gradually decreased from a region adjacent to the gate electrode 16 to the drain region 20, whereas a bottom profile of the top doped region 14 is presented approximately in linearity. In addition, a dopant concentration gradient of each region in the top doped region 14 can be different from each other.

The source region 22 of the first conductivity type is located in the heavily doped region 34 at a second side of the gate electrode 16. A dopant concentration of the source region 22 is higher than that of the heavily region 34. The source region 22 surrounds the drain region 20. More specifically, the source region 22 is surrounded outside of the top doped region 14.

Moreover, the third doped region 32 of the aforementioned metal oxide semiconductor field transistor 100 may further include a sixth doped region 42 of the second conductivity type as a pick up for the substrate 10. Furthermore, the substrate 10 may further include a seventh doped region 44 and an eighth doped region 46 (illustrated in FIG. 2). The seventh doped region 44 of the second conductivity type is located around the second doped region 30. The eighth doped region 46 of the second conductivity type is located within the seventh doped region 44.

Referring to FIG. 1B and FIG. 1C, the metal oxide semiconductor field transistor 100 may further include a fifth doped region 26 of the second conductivity type and adjacent to the drain region 20, the fifth doped region 26 may be located around the drain region 20 in the heavily doped region 36 (FIG. 1B), or within a region surrounded by the drain region 20 (FIG. 1C).

The aforementioned first conductivity type may be P-type or N-type, while the aforementioned second conductivity type may be N-type or P-type. In the present embodiments, the first conductivity type is N-type and the second conductivity type is P-type, but the invention is not limited thereto.

FIGS. 3A to 3E are cross-sectional diagrams illustrating a method of fabricating a metal oxide semiconductor field transistor according to an embodiment of the present invention. FIG. 4 is a schematic diagram illustrating an ion implanting mask for forming a top doped region.

Figures 3A, 3B:
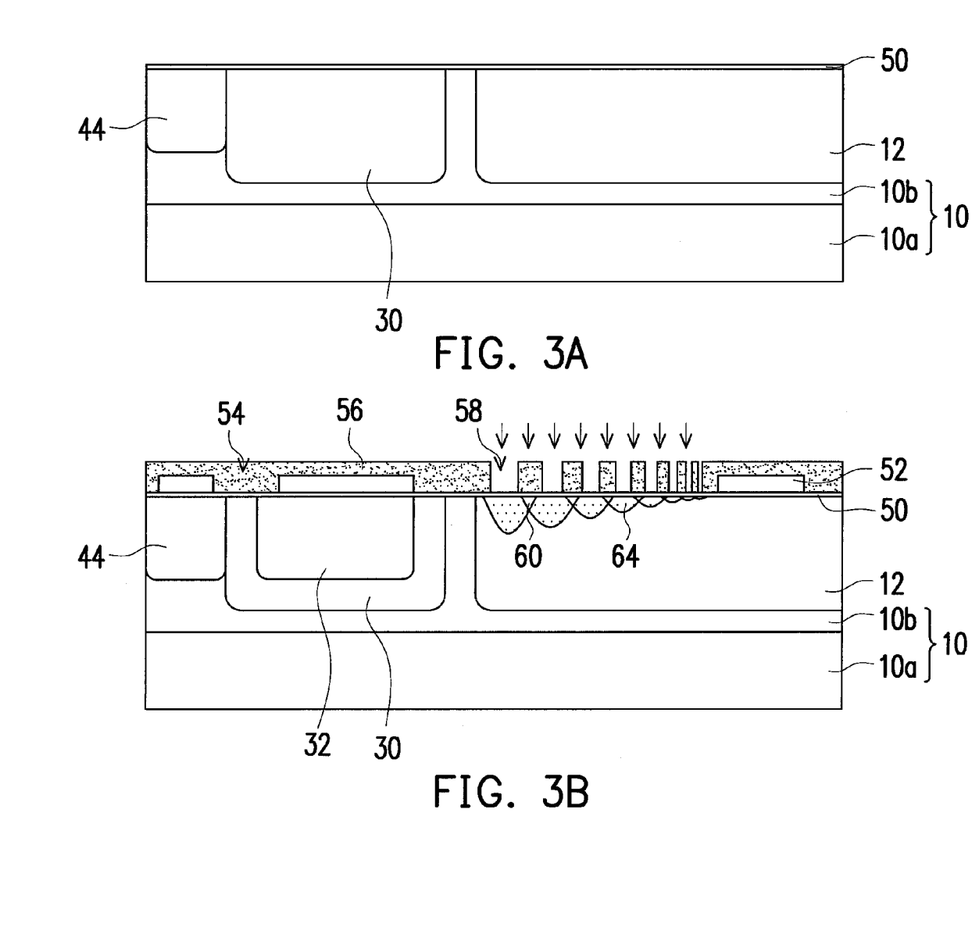
FIGS. 3A to 3E are cross-sectional diagrams illustrating a method of fabricating a metal oxide semiconductor field transistor according to an embodiment of the present invention.
Figure 4:
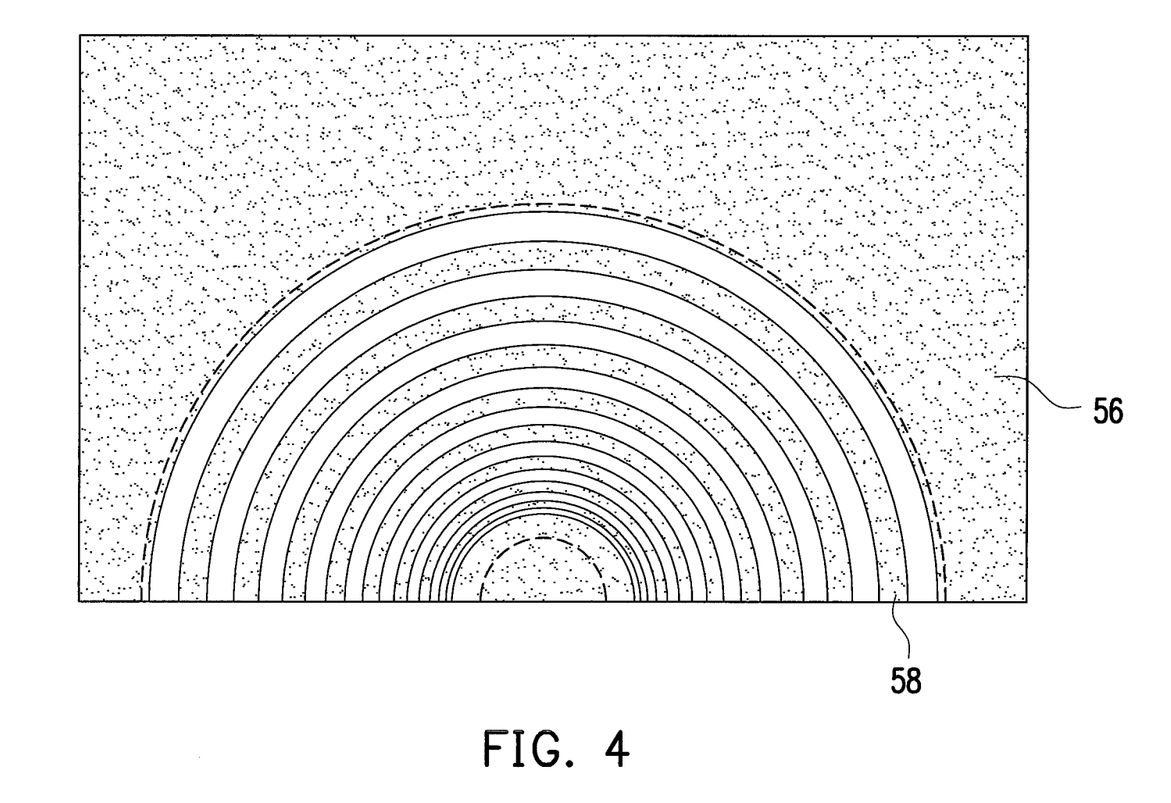
FIG. 4 is a schematic diagram illustrating an ion implanting mask for forming a top doped region.

Referring to FIG. 3A, the first doped region 12, the second doped region 30 and the seventh doped region 44 are formed in the substrate 10. The substrate 10 is, for example, the semiconductor substrate 10a, and an epitaxial layer 10b may be formed on the semiconductor substrate 10a. The semiconductor substrate 10a is a P-type substrate, while the epitaxial layer 10b is a N-type layer (N-epi). The first doped region 12, the second doped region 30 and the seventh doped region 44 may be respectively formed by forming an ion implanting mask on the substrate 10 first, and performing an ion implantation process to implant dopants into the epitaxial layer 10b, followed by performing an annealing process. Sequence for forming the first doped region 12, the second doped region 30 and the seventh doped region 44 may be adjusted according to actual demands without any particular limitation. A doping dosage for the first doped region 12 is, for example, $5 \times 10^{11}$ to $2 \times 10^{13}/cm^2$. A doping dosage for the second doped region 30 is, for example, $1 \times 10^{12}$ to $5 \times 10^{13}/cm^2$. A pad oxide layer 50 may be formed on the substrate 10 before performing the ion implantation process. The method of forming the pad oxide layer 50 is, for example, a thermal oxidation process.

Afterwards, referring to FIG. 3B and FIG. 4, the third doped region 32 is formed in the second doped region 30. The third doped region 32 may also be formed by forming an ion implanting mask first, and performing an ion implantation process to implant dopants into the second doped region 30, followed by performing an annealing process. A doping dosage for the third doped region 32 is, for example, $5 \times 10^{12}$ to $1 \times 10^{14}/cm^2$.

After that, a mask layer 52 is formed on the pad oxide layer 50. The mask layer 52 has a plurality of openings 54. An isolation structure is predetermined to be formed on the substrate 10 below the openings 54. Next, a patterned mask layer 56 is formed on the substrate 10. The patterned mask layer 56 may include at least three regions. In the present embodiment, the patterned mask layer 56 may include four regions respectively corresponding to the aforementioned regions 14a, 14b, 14c and 14d in FIG. 1A, 1B or 1C. Each of the regions has a plurality of openings 58. A dimension of the aforementioned openings 58 of each region is gradually decreased from a region predetermined for forming the gate electrode to a region predetermined for forming the drain region (illustrated as from left to right in the FIG. 3B). A distance between two adjacent openings 58 of each region (i.e., the patterned mask layer 56) is gradually decreased from a region predetermined for forming the gate electrode to a region predetermined for forming the drain region (illustrated as from left to right in the FIG. 3B). The patterned mask layer 56 may be a hard mask layer or a photoresist layer. A material of the hard mask layer may be silicon nitride. The hard mask layer may be formed by depositing a mask material layer through a chemical vapor deposition and patterning the mask material layer by photolithography and etching processes. When the photoresist material is used for the mask layer, photolithography process may be directly used as the patterning method thereof.

Next, a plurality of doped regions 64 may be formed in the first doped region 12 by performing a single ion implantation process to implant dopants into the first doped region 12 by using the patterned mask layer 56 as an ion implanting mask. Two adjacent doped regions 64 may overlap each other to form overlapping regions 60 relatively below the patterned mask layer 56. A size of the overlapping region 60 may be related to the distance (i.e., the patterned mask layer 56) between two adjacent openings 58.

Figure 3C:
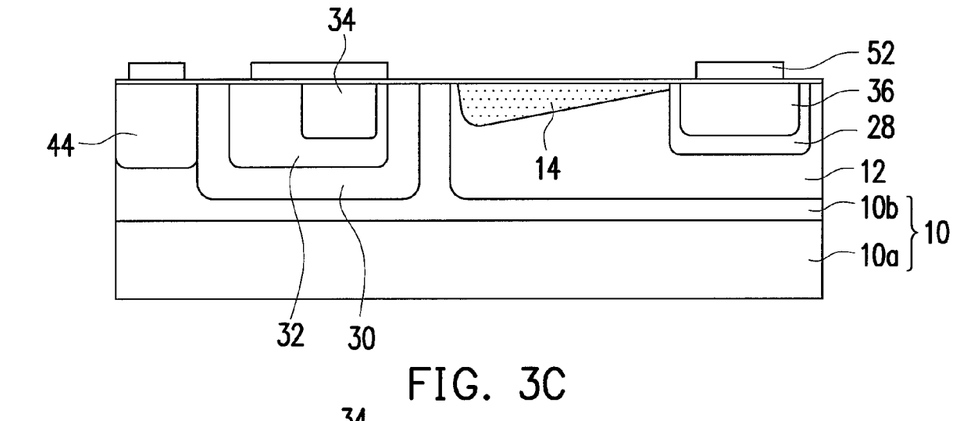

Afterwards, referring to FIG. 3C, the patterned mask layer 56 is removed. Thereafter, the annealing process is performed. During the annealing process, the overlapping regions 60 may be diffused uniformly to form the top doped region 14 along with the non-overlapping regions. A temperature of the annealing process is, for example, ranged from 900° C. to 1150° C.

The top doped region 14 includes the top turning region 14a, the rectangle region 14b, the bottom internal turning region 14c and the bottom external turning region 14d as illustrated in FIG. 1A, 1B or 1C. The top turning region 14a surrounds the starting portion 20a of the drain region 20. The rectangle region 14b is located around the connecting portion 20b of the drain region 20. The bottom internal turning region 14c is located within a region surrounded by the bottom portion 20c of the drain region 20. The bottom external turning region 14d is located outside of a region surrounded by the bottom portion 20c of the drain region 20. Each of the three regions in the top doped region 14 has a dopant concentration gradient, each of the regions of the top doped region 14 has a smooth profile in the bottom portion, and a concentration of each region is gradually decreased from a region predetermined for forming the gate electrode to a region predetermined for forming the drain region (illustrated as from left to right in FIG. 3). According to an embodiment, a dopant concentration of each region of the top doped region 14 is in linearity. That is, each of the dopant concentration is gradually decreased in linearity from a region predetermined for forming the gate electrode to a region predetermined for forming the drain region (illustrated as from left to right in FIG. 3). A depth of each region in the top doped region 14 is gradually decreased from a region predetermined for forming the gate electrode to a region predetermined for forming the drain region, whereas a bottom profile of the top doped region 14 is smooth and approximately in linearity. In addition, a dopant concentration gradient of each region in the top doped region 14 is different from each other. By adjusting the dimension and the distance of the openings of the mask to form different dopant concentration gradients in single or multiple regions through a single ion implanting process, the fabricating process may be greatly simplified without increasing costs to the fabricating process. In the top doped region 14 of an embodiment, a doping concentration of a region adjacent to where being predetermined for forming the gate electrode 16 is $1.67 \times 10^{16}$ to $2.5 \times 10^{17}/cm^3$ while a depth thereof is 2 to 3 μm; a doping concentration of a region adjacent the drain region 20 is $3 \times 10^{15}$ to $1.67 \times 10^{17}/cm^3$ while a depth thereof is 0.3 to 1 μm. In the top doped region 14 of another embodiment, a doping concentration of a region adjacent to where being predetermined for forming the gate electrode 16 is $3.4 \times 10^{16}/cm^3$ while a depth thereof is 2.85 μm, a doping concentration of a region adjacent the drain region 20 is $1.37 \times 10^{16}/cm^3$ while a depth thereof is 0.5 μm. The doping concentration of the top doped region 14 may be adjusted according to requirement, and not limited thereto.

Afterwards, a heavily doped region 36 is formed in the fourth doped region 28 and a heavily doped region 34 is formed in the third doped region 32. The heavily doped region 34 and 36 may also be formed by forming an ion implanting mask first, and performing an ion implantation process to respectively implant dopants into the fourth doped region 28 and the third doped region 32, followed by performing an annealing process.

Figure 3D:
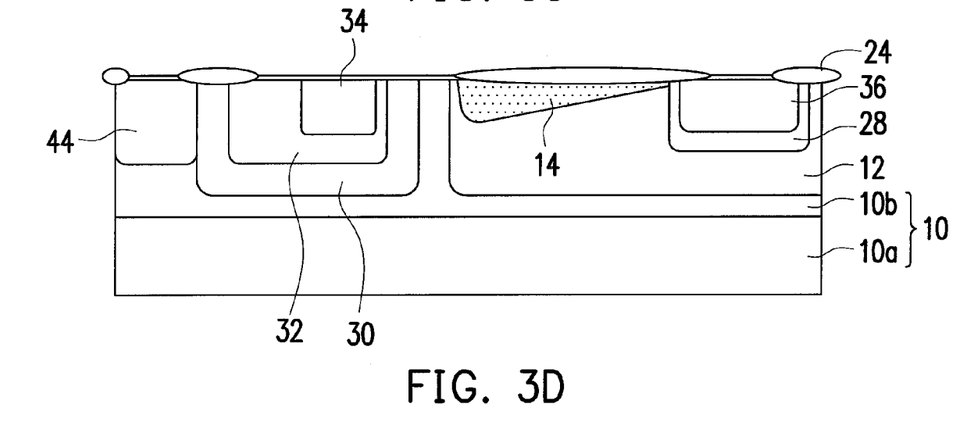

Thereafter, referring to FIG. 3D, the isolation structure 24 is formed on the substrate 10. The isolation structure 24 may be formed by using a local thermal oxidation, which forms a local thermal oxide layer in the openings 54 exposed by the mask layer 52. Thereafter, the mask layer 52 and the pad oxide layer 50 are removed. However, the invention is not limited thereto.

Figure 3E:
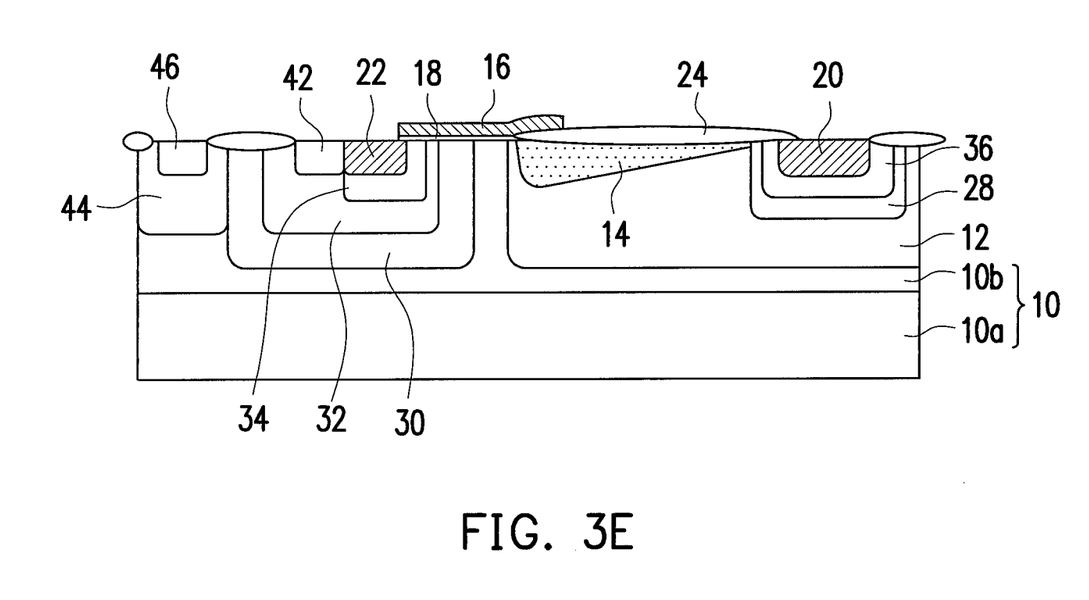

Next, referring to FIG. 3E, the gate dielectric layer 18 and the gate electrode 16 are formed on the substrate 10. The gate dielectric layer 18 may include a single material layer. The single material layer is, for example, a low dielectric constant material or a high dielectric constant material. The low dielectric constant material refers to a dielectric material having dielectric constant of less than 4, such as silicon oxide or silicon nitride. The high dielectric constant material refers to a dielectric material having dielectric constant of more than 4, such as HfAlO, $HfO_2$, $Al_2O_3$ or $Si_3N_4$. The gate dielectric layer 18 may have various thickness based on the various dielectric materials being selected. For example, if the gate dielectric layer 18 is made of silicon oxide, a thickness of the gate dielectric layer 18 may range from 12 nm to 200 nm. The gate electrode 16 is made of a stacking layer of conductive materials such as metal, undoped polysilicon, doped polysilicon, polysilicide or a combination thereof. The gate dielectric layer 18 and the gate electrode 16 may be formed by patterning with lithography and etching processes after the gate dielectric material layer and the gate electrode conductor layer are formed. Afterwards, the drain region 20 and the source region 22 are respectively formed in the heavily doped regions 34 and 36. According to an embodiment, a doping dosage for the drain region 20 and the source region 22 is, for example, $5 \times 10^{14}$ to $8 \times 10^{15}/cm^2$.

Figure 5:
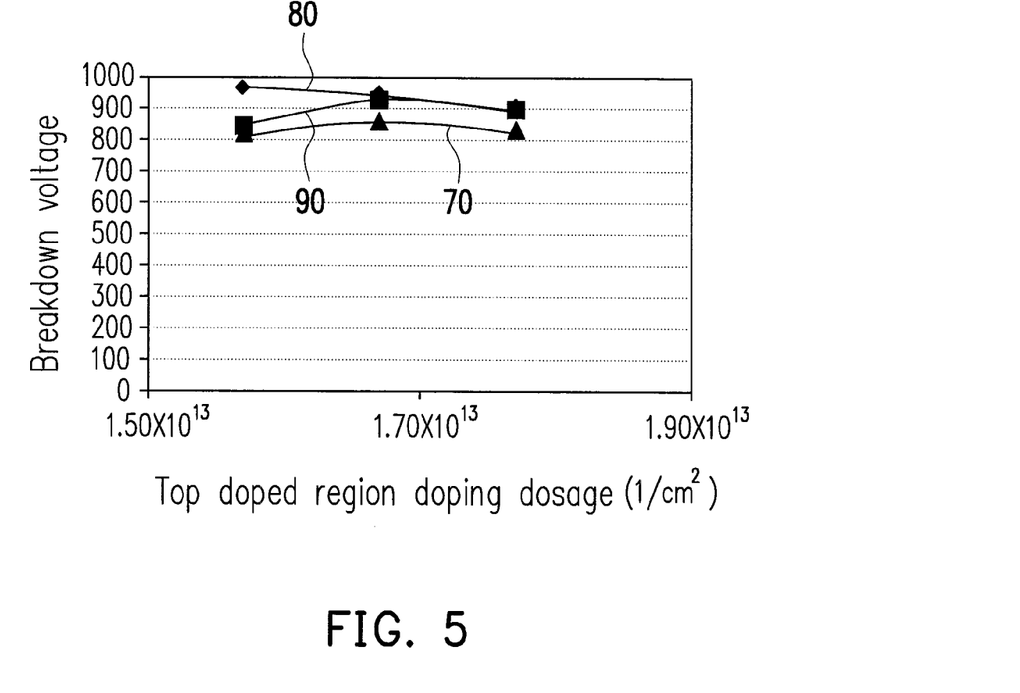
FIG. 5 is a curve diagram of a simulated breakdown voltage in different regions of the top doped region having different designed dopant concentration gradient according to the invention.
Figure 6:
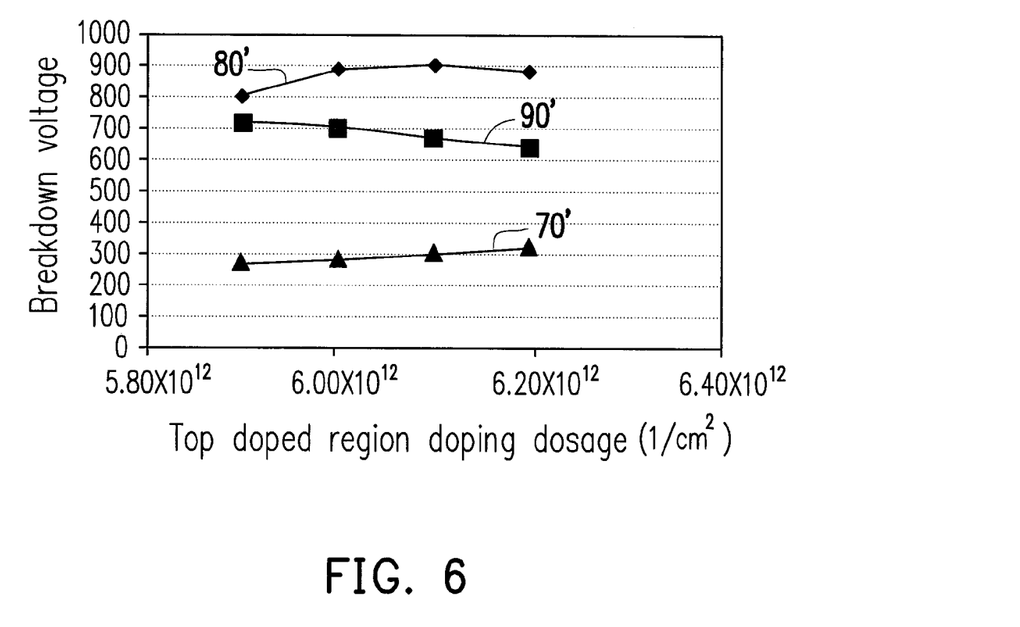
FIG. 6 is a curve diagram of a simulated breakdown voltage in conventional top doped region having a single uniformed concentration.

FIG. 5 is a curve diagram of a simulated breakdown voltage in different regions of the top doped region having different designed dopant concentration gradient according to the invention. FIG. 6 is a curve diagram of a simulated breakdown voltage in conventional top doped region having a single uniformed concentration.

Referring to FIG. 5, according to the embodiments of the invention, as a result to a simulation of elements corresponding to regions in FIG. 1A, a breakdown curve 70 (corresponding to the top turning region 14a), a breakdown curve 80 (corresponding to the rectangle region 14b) and a breakdown curve 90 (corresponding to the bottom internal turning region 14c), which are very close to each other. This indicates that the problem of current accumulation at drain and source terminals may be solved by adjusting dopant concentration gradient based on different regions of the top doped region, such that elements in each region may have a consistent breakdown voltage. Referring to FIG. 6, as a result to a simulation of conventional elements corresponding to regions in FIG. 1A, a breakdown curve 70' (corresponding to the top turning region 14a), a breakdown curve 80' (corresponding to the rectangle region 14b) and a breakdown curve 90' (corresponding to the bottom internal turning region 14c), which are very different from each other, and the breakdown voltage of the top turning region 14a is extremely low.

Figure 7:
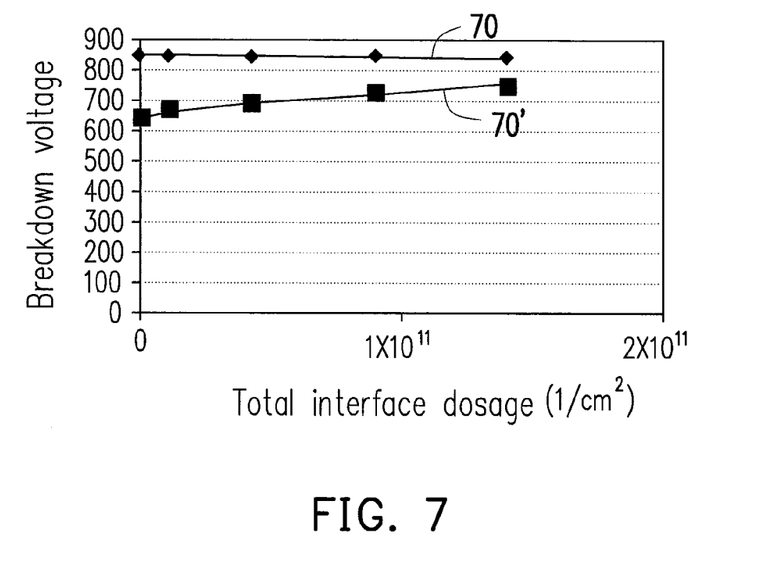
FIG. 7 is a comparison diagram of simulated breakdown voltages in top turning regions of the top doped regions respectively using the dopant concentration gradient in embodiments of the invention and a single uniformed concentration of conventional art.
Figure 8:
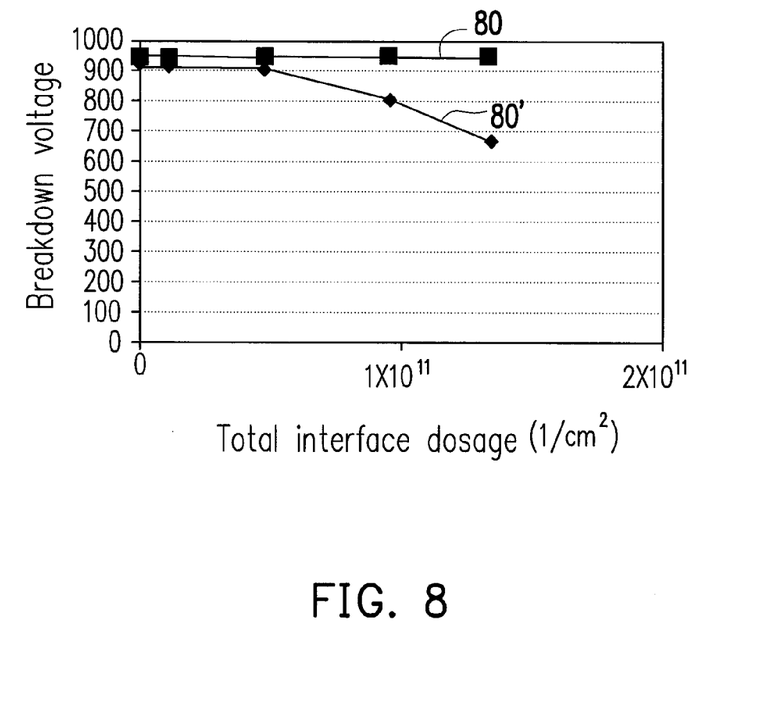
FIG. 8 is a comparison diagram of simulated breakdown voltages in rectangle regions of the top doped regions respectively using the dopant concentration gradient in embodiments of the invention and a single uniformed concentration of conventional art.
Figure 9:
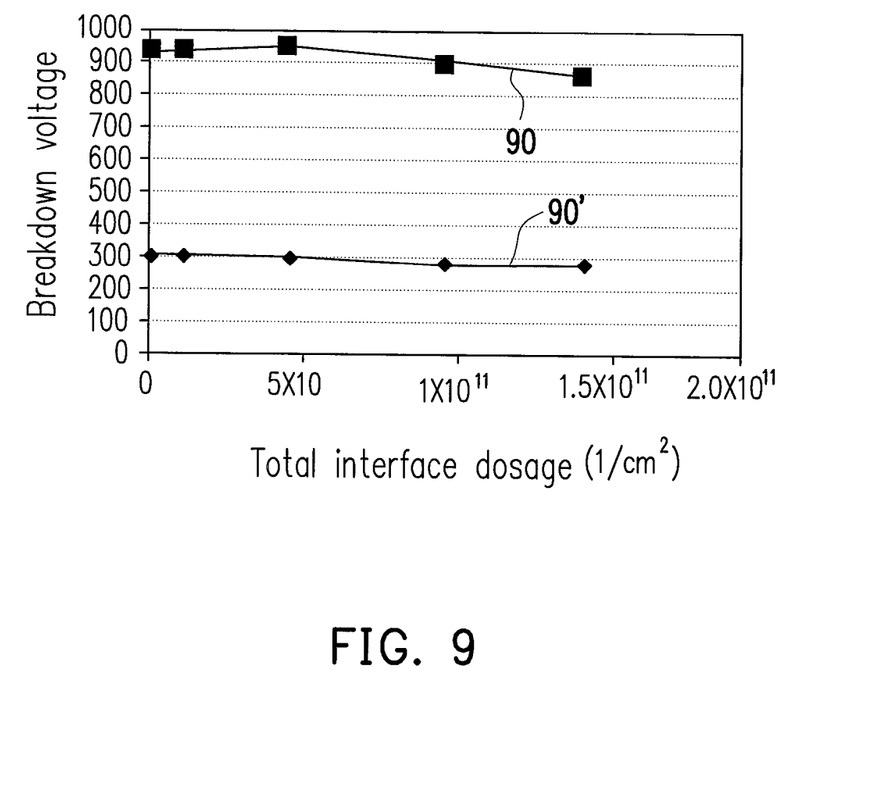
FIG. 9 is a comparison diagram of simulated breakdown voltages in bottom turning regions of the top doped regions respectively using the dopant concentration gradient in embodiments of the invention and a single uniformed concentration of conventional art.

FIG. 7 is a comparison diagram of simulated breakdown voltages in top turning regions of the top doped regions respectively using the dopant concentration gradient of the embodiment of this invention and a single uniformed concentration of conventional art. FIG. 8 is a comparison diagram of simulated breakdown voltages in rectangle regions of the top doped regions respectively using the dopant concentration gradient of the embodiment of this invention and a single uniformed concentration of conventional art. FIG. 9 is a comparison diagram of simulated breakdown voltages in bottom internal turning regions of the top doped regions respectively using the dopant concentration gradient of the embodiment of this invention and a single uniformed concentration of conventional art.

In view of FIG. 7, the break down curve 70 is above the breakdown curve 70', which indicates that the breakdown voltage of the top doped region (in which the top turning region 14a corresponding to FIG. 1A adapts the dopant concentration gradient of the invention) is higher than the breakdown voltage of the top doped region which adapts the single uniformed concentration of conventional art. The same situation may also be found in FIG. 8 and FIG. 9. Particularly in FIG. 9, the breakdown curve 90 is far higher than the breakdown curve 90', which indicates that the top doped region (in which the bottom internal turning region 14c corresponding to FIG. 1A adapts the dopant concentration gradient of the invention) may significantly increase the breakdown voltage, so that the problem of current accumulation at drain terminal and/or source terminal may be effectively solved.

The metal oxide semiconductor field transistor in embodiments of the invention includes a top doped region. A conductivity type of said top doped region is different from a conductivity type of a source region and a drain region. The top doped region is located in the substrate between the source region and the drain region and includes multiple regions according to different shapes and positions of the drain region. Each of the regions has a dopant concentration gradient and a concentration of each region is gradually decreased from a region adjacent to the gate electrode to a region adjacent to the drain region. In addition, a profile depth in each region of the top doped region is smoothly, linearly and gradually decreased from a region adjacent to the gate electrode to a region adjacent to the drain region. Such top doped region may reduce on-state resistance and increase breakdown voltage. The top doped region may be formed by using a single ion implantation process with an alteration of a pattern of a photomask, so that different regions may have different dopant concentration gradients. The pattern of the photomask may include multiple regions based on different shapes and positions of the drain region and the source region. Therefore, additional photomasks or additional ion implantation process are not required to fabricate the top doped region in embodiments of the invention.

Based on above, the metal oxide semiconductor field transistor in the embodiments of the invention may solve the problem of current accumulation at drain terminals and/or source terminals by designing different dopant concentration gradients based on different regions of the top doped region, such that the breakdown voltage of the elements therein may be increased and the on-state resistance of the elements may be reduced. Moreover, only a photomask is required when forming the top doped region having different dopant concentration gradients. By adjusting the dimension and the distance of the openings of the mask through a single ion implantation process, different dopant concentration gradients may be formed according to the differences of the regions. Therefore, a fabricating process thereof may be greatly simplified without increasing costs to the fabricating process.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A metal oxide semiconductor field transistor, comprising:
   a drain region of a first conductivity type and located in a substrate;
   a source region of the first conductivity type, located in the substrate and surrounding the drain region;
   a gate electrode, located above the substrate between the source region and the drain region;
   a gate dielectric layer, located between the gate electrode and the substrate; and
   a top doped region of a second conductivity type, located in the substrate between the source region and the drain region, wherein the top doped region comprises at least three regions respectively having a dopant concentration gradient and a concentration gradually decreased from a region adjacent to the gate electrode to a region adjacent to the drain region.

2. The metal oxide semiconductor field transistor according to claim 1, wherein the dopant concentration gradient of each of the at least three regions in the top doped region is respectively different from each other.

3. The metal oxide semiconductor field transistor according to claim 1, wherein a shape of the drain region projected to a surface of the substrate comprises at least a U shape.

4. The metal oxide semiconductor field transistor according to claim 3, wherein the at least three regions in the top doped region comprises a top turning region, a rectangle region, a bottom internal turning region and a bottom external turning region.

5. The metal oxide semiconductor field transistor according to claim 1, further comprising:
   a first doped region of the first conductivity type, located in the substrate around the drain region, wherein the top doped region and the drain region are located in the first doped region;
   a second doped region of the first conductivity type, located in the substrate around the source region;
   a third doped region of the second conductivity type, located in the second doped region of the first conductivity type;
   a fourth doped region of the first conductivity type, located in the first doped region of the first conductivity type and adjacent to the top doped region; and
   two heavily doped regions of the first conductivity type, respectively located in the fourth doped region and the third doped region, wherein the source region and the drain region are respectively located in the two heavily doped regions.

6. The metal oxide semiconductor field transistor according to claim 5, further comprising an isolation structure located on the top doped region.

7. The metal oxide semiconductor field transistor according to claim 6, wherein the gate electrode is partially located on the isolation structure and covers the top doped region.

8. The metal oxide semiconductor field transistor according to claim 5, further comprising an epitaxial layer of the first conductivity type, located in the substrate, wherein the first doped region and the second doped region are located in the epitaxial layer.

9. The metal oxide semiconductor field transistor according to claim 1, further comprising a fifth doped region of the second conductivity type, wherein the fifth doped region is adjacent to the drain region.

10. The metal oxide semiconductor field transistor according to claim 1, wherein the first conductivity type is an N-type while the second conductivity type is a P-type; and the first conductivity type is a P-type while the second conductivity type is an N-type.

11. A method of fabricating a metal oxide semiconductor field transistor, comprising
   forming a patterned mask layer on a substrate, wherein the patterned mask layer has a plurality of openings;
   performing an ion implantation process to form a top doped region in the substrate using the patterned mask layer as a mask;
   forming a gate dielectric layer and a gate electrode on the substrate;
   forming a drain region of a first conductivity type on a first side of the gate electrode in the substrate; and
   forming a source region of the first conductivity type on a second side of the gate electrode and surrounding the drain region,
   wherein the top doped region of a second conductivity type is located between the source region and the drain region, the top doped region has a dopant concentration gradient, and the dopant concentration gradient has a concentration gradually decreased from a region adjacent to the gate electrode to a region adjacent to the drain region.

12. The method of fabricating the metal oxide semiconductor field transistor according to claim 11, wherein the plurality of openings of the patterned mask layer has a dimension gradually decreased from a region adjacent to where being predetermined for forming the source region to a region adjacent to where being predetermined for forming the drain region.

13. The method of fabricating the metal oxide semiconductor field transistor according to claim 11, wherein the plurality of openings of the patterned mask layer has a distance between two of adjacent openings gradually decreased from a region adjacent to where being predetermined for forming the source region to a region adjacent to where being predetermined for forming the drain region.

14. The method of fabricating the metal oxide semiconductor field transistor according to claim 11, further comprising performing an annealing process to smooth a profile of the top doped region.

15. The method of fabricating a metal oxide semiconductor field transistor according to claim 14, wherein a temperature of the annealing process ranges from 900° C. to 1150° C.

16. The method of fabricating the metal oxide semiconductor field transistor according to claim 11, wherein the top doped region comprises a plurality of regions and each of the plurality of regions respectively has the dopant concentration gradient.

17. The method of fabricating the metal oxide semiconductor field transistor according to claim 11, wherein a shape of the drain region projected to a surface of the substrate comprises at least a U shape, the top doped region comprises a plurality of regions and the plurality of regions each respectively has the dopant concentration gradient.

18. The method of fabricating the metal oxide semiconductor field transistor according to claim 11, further comprising:
   forming a first doped region of the first conductivity type in the substrate around the drain region, wherein the top doped region and the drain region are located in the first doped region;
   forming a second doped region of the first conductivity type in the substrate around the source region;
   forming a third doped region of the second conductivity type in the second doped region;
   forming a fourth doped region of the first conductivity type, wherein the fourth doped region is adjacent to the top doped region in the first doped region; and
   forming a heavily doped region of the first conductivity type respectively in the fourth doped region and the third doped region, wherein the source region and the drain region are respectively located in the heavily doped region.

19. The method of fabricating the metal oxide semiconductor field transistor according to claim 18, further comprising forming an isolation structure on the top doped region.

20. The method of fabricating the metal oxide semiconductor field transistor according to claim 18, further comprising forming an epitaxial layer of the first conductivity type on the substrate, wherein the first doped region and the second doped region are located in the epitaxial layer.

* * * * *